United States Patent
Jokar et al.

(10) Patent No.: US 11,150,305 B2
(45) Date of Patent: Oct. 19, 2021

(54) METHOD OF ESTIMATING RESIDUAL ENERGY FOR A BATTERY

(71) Applicant: KARMA AUTOMOTIVE LLC, Irvine, CA (US)

(72) Inventors: Ali Jokar, Irvine, CA (US); Suvrat Ramasubramanian, Costa Mesa, CA (US); Jing Hong, Trabuco Canyon, CA (US)

(73) Assignee: KARMA AUTOMOTIVE LLC, Irvine, CA (US)

( * ) Notice: Subject to any disclaimer, the term of this patent is extended or adjusted under 35 U.S.C. 154(b) by 168 days.

(21) Appl. No.: 16/560,803

(22) Filed: Sep. 4, 2019

(65) Prior Publication Data

US 2021/0063491 A1 Mar. 4, 2021

(51) Int. Cl.
| | | |
|---|---|---|
| *G01R 31/382* | (2019.01) | |
| *G01R 31/367* | (2019.01) | |
| *B60L 58/16* | (2019.01) | |
| *B60L 58/12* | (2019.01) | |
| *G01R 31/392* | (2019.01) | |

(52) U.S. Cl.
CPC ............ *G01R 31/382* (2019.01); *B60L 58/12* (2019.02); *B60L 58/16* (2019.02); *G01R 31/367* (2019.01); *G01R 31/392* (2019.01)

(58) Field of Classification Search
CPC .. G01R 31/382; G01R 31/367; G01R 31/392; B60L 58/16; B60L 58/12
See application file for complete search history.

(56) References Cited

U.S. PATENT DOCUMENTS

| | | | | |
|---|---|---|---|---|
| 9,056,556 | B1 * | 6/2015 | Hyde | B60L 58/20 |
| 9,079,505 | B1 * | 7/2015 | Hyde | B60L 58/10 |
| 9,478,850 | B2 * | 10/2016 | Bourilkov | H01Q 1/38 |
| 10,181,800 | B1 * | 1/2019 | Nayar | H02J 7/00 |
| 10,211,487 | B2 * | 2/2019 | Kim | G01R 31/3648 |
| 10,365,331 | B2 * | 7/2019 | Bryngelsson | G01R 31/392 |
| 2004/0145371 | A1 * | 7/2004 | Bertness | H02J 7/0048 |
| | | | | 324/426 |
| 2007/0090844 | A1 * | 4/2007 | Klang | G01R 31/3648 |
| | | | | 324/426 |
| 2007/0114972 | A1 * | 5/2007 | Koo | G01R 31/392 |
| | | | | 320/132 |
| 2008/0054848 | A1 * | 3/2008 | Yun | G01R 31/367 |
| | | | | 320/134 |
| 2013/0138369 | A1 * | 5/2013 | Papana | B60L 58/12 |
| | | | | 702/63 |

(Continued)

*Primary Examiner* — Tung S Lau
(74) *Attorney, Agent, or Firm* — Gordon Rees Scully Mansukhani, LLP

(57) ABSTRACT

A method of estimating the residual energy of a battery. The method comprises determining the battery's state of charge (SOC) and dischargeable capacity to determine the battery's state of energy (SOE), determining the battery's reference dischargeable energy ($E_{ref}$) and total dischargeable energy ($E_{tot}$), and comparing the state of energy to the total dischargeable energy to find the residual energy of the battery. The various functions of the method use battery current, cell temperature, and state of health (SOH) as variables for consideration.

20 Claims, 4 Drawing Sheets

(56) References Cited

U.S. PATENT DOCUMENTS

| | | | |
|---|---|---|---|
| 2013/0169236 A1* | 7/2013 | Schaefer | H01M 10/486 320/136 |
| 2015/0239365 A1* | 8/2015 | Hyde | B60L 1/06 701/2 |
| 2015/0357865 A1* | 12/2015 | Bailey | G06F 1/30 713/324 |
| 2016/0236794 A1* | 8/2016 | Tucker | B64D 43/02 |
| 2016/0331614 A1* | 11/2016 | Furman | A61G 7/0506 |
| 2017/0141369 A1* | 5/2017 | Burke | H01M 10/486 |
| 2017/0361729 A1* | 12/2017 | Bryngelsson | B60L 58/16 |
| 2018/0095141 A1* | 4/2018 | Wild | B60L 58/12 |
| 2018/0143035 A1* | 5/2018 | Ricci | B60W 10/08 |
| 2018/0201152 A1* | 7/2018 | Newman | B60L 53/14 |
| 2018/0348304 A1* | 12/2018 | Tang | G01R 31/382 |
| 2019/0118655 A1* | 4/2019 | Grimes | B60L 3/0046 |
| 2019/0363551 A1* | 11/2019 | Patey | G01R 31/392 |
| 2021/0141028 A1* | 5/2021 | Du | G01R 31/367 |

\* cited by examiner

METHOD OF ESTIMATING RESIDUAL ENERGY FOR A BATTERY

BACKGROUND

The present disclosure relates to a method of estimating the residual energy of a battery. Li-ion batteries have been used as the source of energy for many electrical systems, especially in hybrid electric vehicles (HEVs) and electric vehicles (EVs). In these vehicles, the battery interacts with other components using a Battery Management System (BMS) to provide power to the vehicle and meet the vehicle's energy demand while maintaining the safety of the electrical system.

The reliability of these electrical systems is highly dependent of the health and safety of the battery. Controlling and monitoring a battery installed in an HEV or EV is impossible without a fast and accurate model to be used by the BMS. Li-ion battery models have been used for estimating metrics of the battery, including state-of-charge (SOC), state-of-health (SOH), state-of-energy (SOE) and state-of-power (SOP). Also, the battery models are employed to help BMSs with the functions of battery control, real-time observation, parameter estimation, and optimization of the battery.

In order to calculate mileage of HEVs and EVs, it is important to estimate the residual energy of the battery—the amount of energy available for power systems to draw from the battery. Due to ease of implementation, all presently available BMSs use a simple structure to determine SOE or ignore different important parameters during calculating the battery pack residual energy. Conventional methods for calculating battery pack residual energy is to consider only the SOC and total energy of the battery pack at the fresh cell condition and 25° C. However, the use of SOC alone in the residual energy estimate produces an inaccurate result, especially since SOC represents the battery's residual charge rather than the battery's residual energy. Factors such as battery temperature, ambient temperature, SOH, and battery discharge current all affect the battery residual energy. Simplified estimation methods have caused inaccurate energy estimates especially in aged batteries, low temperature conditions, and batteries with low SOC.

To address this problem, it is necessary to have a SOE estimator that receives feedback from all effective factors.

SUMMARY

Disclosed herein is a method of estimating the residual energy of a battery. In one embodiment, the method comprises determining a state of charge (SOC) of the battery; determining a dischargeable capacity of the battery as a function of a battery current, a cell temperature, and a state of health (SOH) of the battery; correcting the state of charge (SOC) of the battery as a function the state of charge (SOC) of the battery and the dischargeable capacity of the battery; determining a state of energy (SOE) of the battery as a function of the corrected state of charge (SOC), the cell temperature, and the state of health (SOH) of the battery; determining a reference dischargeable energy ($E_{ref}$) of the battery as a function of a specific constant C-rate, the battery temperature, and the state of health (SOH) of the battery; determining a total dischargeable energy ($E_{tot}$) of the battery as a function of the battery current, the cell temperature, the reference dischargeable energy ($E_{ref}$) of the battery, and the state of health (SOH) of the battery; and determining the residual energy of the battery as a function of the state of energy (SOE) of the battery and the total dischargeable energy ($E_{tot}$) of the battery. In one embodiment, the battery is installed in a vehicle.

In another disclosed embodiment, the battery current value is smoothed by a moving average filter operating with a specific sample time.

In another disclosed embodiment, the dischargeable capacity of the battery is determined by a look-up table constructed using empirical data. In another disclosed embodiment, the dischargeable capacity of the battery is determined by use of model-based results.

In another disclosed embodiment, the reference dischargeable energy ($E_{ref}$) of the battery is determined by a look-up table constructed using empirical data. In another disclosed embodiment, the reference dischargeable energy ($E_{ref}$) of the battery is determined by use of model-based results.

In another disclosed embodiment, the total dischargeable energy ($E_{tot}$) of the battery is determined by a look-up table constructed using empirical data. In another disclosed embodiment, the total dischargeable energy ($E_{tot}$) of the battery is determined by use of model-based results.

In another disclosed embodiment, the state of energy (SOE) of the battery is determined by a look-up table constructed using empirical data. In another disclosed embodiment, the state of energy (SOE) of the battery is determined by use of model-based results.

Other aspects, features, and techniques will be apparent to one skilled in the relevant art in view of the following detailed description of the embodiments.

BRIEF DESCRIPTION OF THE DRAWINGS

The features, objects, and advantages of the disclosed embodiments will become more apparent from the detailed description set forth below when taken in conjunction with the drawings in which like reference characters identify correspondingly throughout and wherein.

DETAILED DESCRIPTION

One aspect of the disclosure is directed to a method of estimating the residual energy of a battery.

References throughout this document to "one embodiment," "certain embodiments," "an embodiment," or similar term mean that a particular feature, structure, or characteristic described in connection with the embodiment is included in at least one embodiment. Thus, the appearances of such phrases in various places throughout this specification are not necessarily all referring to the same embodiment. Furthermore, the particular features, structures, or characteristics may be combined in any suitable manner on one or more embodiments without limitation. For example, two or more of the innovative methods described herein may be combined in a single method, but the application is not limited to the specific exemplary combinations of methods that are described herein.

As used herein, the terms "a" or "an" shall mean one or more than one. The term "plurality" shall mean two or more than two. The term "another" is defined as a second or more. The terms "including" and/or "having" are open ended (e.g., comprising). The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

A detailed description of various embodiments is provided; however, it is to be understood that the disclosed embodiments are merely exemplary and may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the disclosed embodiments.

Figure 1:
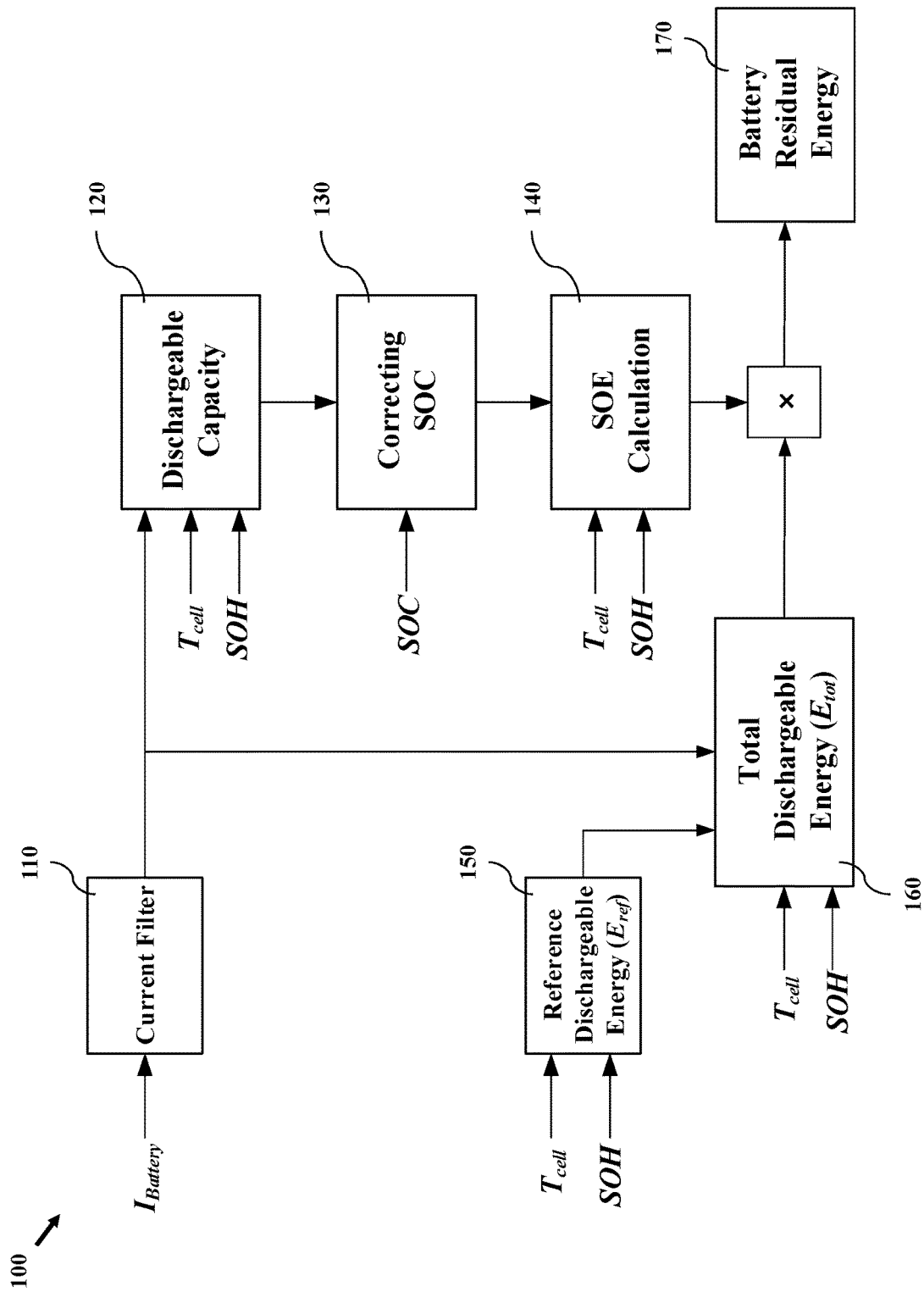
FIG. 1 is a block diagram of an exemplary embodiment of a residual energy estimation method.

FIG. 1 is a block diagram of an exemplary embodiment of a residual energy estimation method 100. In one embodiment, the residual energy estimation method 100 comprises a current filter block 110, a dischargeable capacity calculation block 120, a SOC correction block 130, a SOE calculation block 140, a reference dischargeable energy calculation block 150, a total dischargeable energy calculation block 160, and a residual energy calculation block 170.

In one embodiment, the current filter block 110 applies a moving average filter to a battery current value $I_{Battery}$. In one embodiment, $I_{Battery}$ represents the rate at which current discharges from the battery at a given point in time. In one embodiment, the moving average filter operates with a specific sample time, such that any brief and sudden increase or decrease in $I_{Battery}$ is smoothed out.

In one embodiment, the dischargeable capacity calculation block 120 determines a dischargeable capacity of the battery as a function of $I_{Battery}$, cell temperature, and state of health (SOH). In one embodiment, the dischargeable capacity calculation block 120 determines the dischargeable capacity of the battery by means of a look-up table, wherein the look-up table is constructed using empirical data. In another embodiment, the dischargeable capacity calculation block 120 determines the dischargeable capacity of the battery by means of a Li-ion battery model, wherein using $I_{Battery}$, cell temperature, and state of health (SOH) as inputs for the model produces a model-based result for the dischargeable capacity of the battery.

In one embodiment, the SOC correction block 130 determines a dischargeable capacity of the battery as a function of the state of charge (SOC) and the dischargeable capacity of the battery. In one embodiment, the SOC correction block 130 determines a corrected state of charge (SOC) by means of the following two equations:

$$\alpha_{SOC} = \frac{\text{Capacity}(C\text{-}rate, T, SOH) - \text{Capacity}(C_{Default}, T_{Default}, SOH)}{\text{Capacity}(C_{Default}, T_{Default}, SOH)}$$

$$SOC_{Corr} = \frac{SOC + \alpha_{SOC}}{1 + \alpha_{SOC}}$$

wherein the capacity function is a representation of the dischargeable capacity calculation block 120, C-rate is the discharge current of the battery normalized against total battery capacity, $C_{Default}$ is the C-rate of the battery under default conditions, and $T_{Default}$ is the temperature of the battery under default conditions. In one embodiment, the C-rate is based on the battery current value $I_{Battery}$. In one embodiment, a $C_{Default}$ value of 1C and a $T_{Default}$ temperature value of 25° C. are chosen based on a definition of state of charge (SOC) as the percentage of the remaining usable capacity based on total usable capacity at 25° C. with a 1C constant discharge rate from fully charged to the charge value at a minimum cut-off voltage.

In one embodiment, the SOE calculation block 140 determines the state of energy (SOE) of the battery as a function of the corrected state of charge (SOC), the cell temperature, and the state of health (SOH) of the battery. In one embodiment, the SOE calculation block 140 determines the state of energy (SOE) of the battery by means of a look-up table, wherein the look-up table is constructed using empirical data. In another embodiment, the SOE calculation block 140 determines the dischargeable capacity of the battery by means of a Li-ion battery model, wherein using the corrected state of charge (SOC), cell temperature, and state of health (SOH) as inputs for the model produces a model-based result for the state of energy (SOE) of the battery.

In one embodiment, the reference dischargeable energy calculation block 150 determines the reference dischargeable energy ($E_{ref}$) of the battery as a function of a specific constant C-rate, the cell temperature, and the state of health (SOH) of the battery. In one embodiment, the reference dischargeable energy ($E_{ref}$) represents the total energy of the battery that can be discharged, given a specific constant C-rate, as the battery's condition moves between a fully charged state to a depleted state marked by the battery's voltage reaching a minimum cut-off voltage. In one embodiment, the reference dischargeable energy calculation block 150 determines the reference dischargeable energy ($E_{ref}$) of the battery by means of a look-up table, wherein the look-up table is constructed using empirical data. In another embodiment, the reference dischargeable energy calculation block 150 determines the reference dischargeable energy ($E_{ref}$) of the battery by means of a Li-ion battery model, wherein using cell temperature and state of health (SOH) as inputs for the model produces a model-based result for the reference dischargeable energy ($E_{ref}$) of the battery.

In one embodiment, the specific constant C-rate is 1C—this value is typical for HEVs. In another embodiment, the specific constant C-rate is C/3—this value is typical for EVs.

In one embodiment, the total dischargeable energy calculation block 160 determines the total dischargeable energy ($E_{tot}$) of the battery as a function of the battery current, the cell temperature, the reference dischargeable energy ($E_{ref}$) of the battery, and the state of health (SOH) of the battery. In one embodiment, the total dischargeable energy ($E_{tot}$) represents the total energy of the battery that can be discharged, assuming the battery continues to discharge at the present battery current value $I_{Battery}$, as the battery's condition moves between a fully charged state to a depleted state marked by the battery's voltage reaching a minimum cut-off voltage. In one embodiment, the total dischargeable energy calculation block 160 determines the total dischargeable energy ($E_{tot}$) of the battery by means of a look-up table, wherein the look-up table is constructed using empirical data. In another embodiment, the total dischargeable energy calculation block 160 determines the total dischargeable energy ($E_{tot}$) of the battery by means of a Li-ion battery model, wherein using the battery current, reference dischargeable energy ($E_{ref}$), cell temperature, and state of health (SOH) as inputs for the model produces a model-based result for the total dischargeable energy ($E_{tot}$) of the battery.

In one embodiment, the residual energy calculation block 170 determines the residual energy of the battery as a function of the state of energy (SOE) of the battery and the total dischargeable energy ($E_{tot}$) of the battery. In one embodiment, the relationship between state of energy (SOE), residual energy, and total energy can be expressed with the following equation:

$$SOE = \frac{\text{Residual Energy}}{\text{Total Energy}}$$

wherein the terms may be rearranged to produce a function for use in the residual energy calculation block 170:

Residual Energy=SOE×Total Energy

Figure 2:
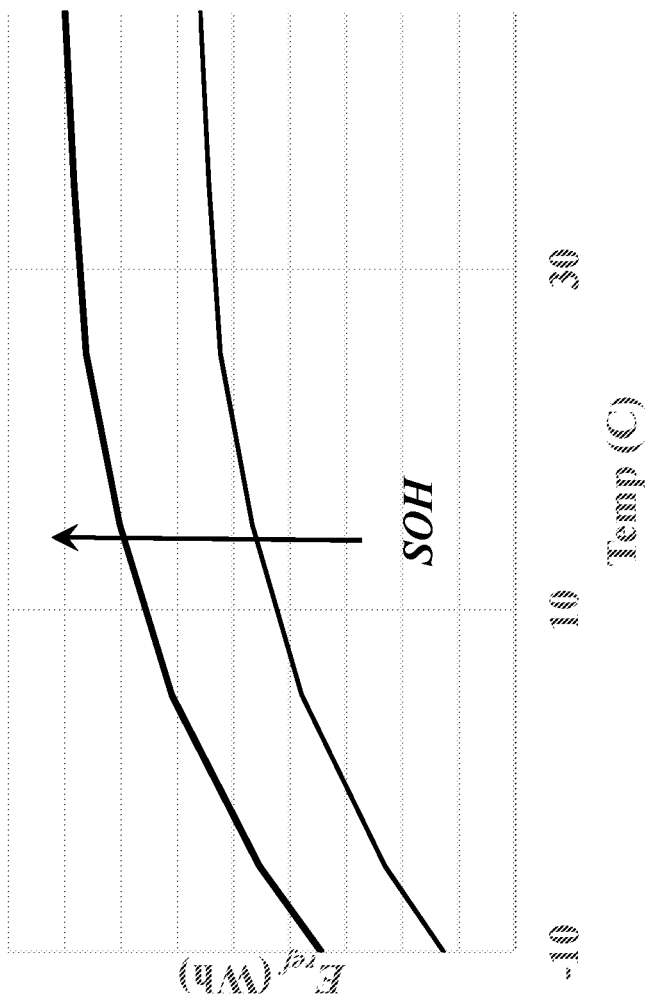
FIG. 2 is a graphic illustration of an exemplary embodiment of a relationship between temperature, state of health (SOH), and battery reference energy ($E_{ref}$).

FIG. 2 is a graphic illustration of an exemplary embodiment of a relationship between temperature, state of health (SOH), and battery reference energy ($E_{ref}$). In one embodiment, the two curves relate to a relationship between temperature and battery reference energy ($E_{ref}$). In one embodiment, the upper curve represents a relationship between temperature and battery reference energy ($E_{ref}$) wherein the battery has a higher state of health (SOH) value.

Figure 3:
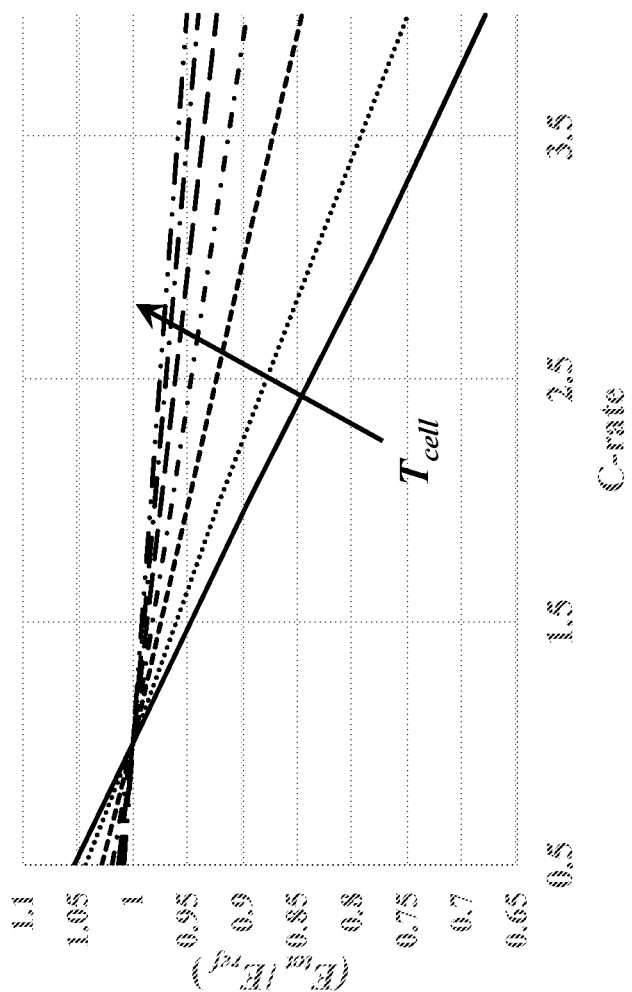
FIG. 3 is a graphic illustration of an exemplary embodiment of a relationship between the ratio of total dischargeable energy and total reference energy ($E_{tot}/E_{ref}$), C-rate, temperature, and state of health (SOH).

FIG. 3 is a graphic illustration of an exemplary embodiment of a relationship between the ratio of total dischargeable energy and total reference energy ($E_{tot}/E_{ref}$), C-rate, temperature, and state of health (SOH). In one embodiment, each of the plurality of curves represents a relationship between the ratio of total dischargeable energy and total reference energy ($E_{tot}/E_{ref}$) and C-rate, wherein the relationship can be expressed with the following equation:

$$\frac{E_{tot}}{E_{ref}} = B \times (C\text{-}rate) + D$$

wherein B represents the slope of the curve and D represents a constant. In one embodiment, the magnitude of B and D decrease as $T_{cell}$ increases.

Figure 4:
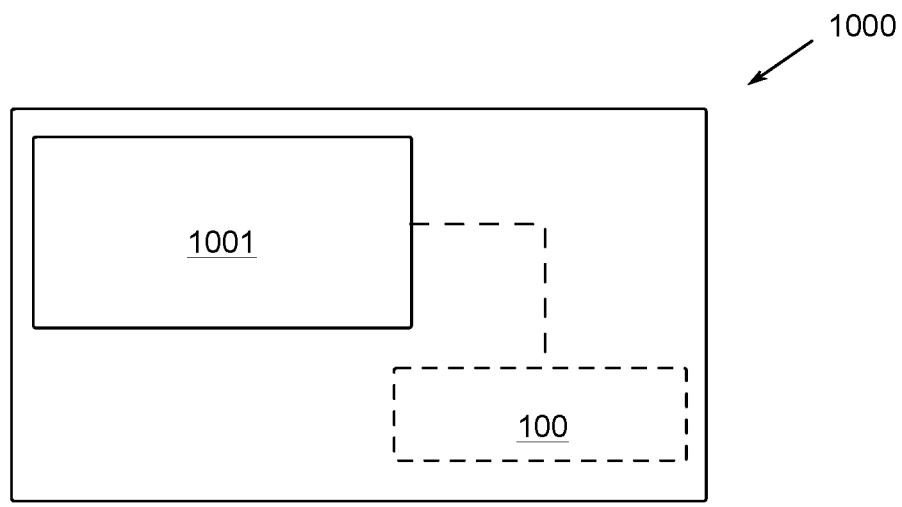
FIG. 4 is a graphic illustration of an exemplary embodiment of a vehicle with a battery.

FIG. 4 shows a simplified schematic of the exemplary embodiment where the battery 1001 is installed in a vehicle 1000 utilizing the residual energy estimation method 100.

While this disclosure makes reference to exemplary embodiments, it will be understood by those skilled in the art that various changes in form and details may be made therein without departing from the scope of the claimed embodiments.

What is claimed is:

1. A method of estimating the residual energy of a battery, comprising:
    determining a state of charge (SOC) of the battery;
    determining a dischargeable capacity of the battery as a function of a battery current, a cell temperature, and a state of health (SOH) of the battery;
    correcting the state of charge (SOC) of the battery as a function the state of charge (SOC) of the battery and the dischargeable capacity of the battery;
    determining a state of energy (SOE) of the battery as a function of the corrected state of charge (SOC), the cell temperature, and the state of health (SOH) of the battery;
    determining a reference dischargeable energy ($E_{ref}$) of the battery as a function of a specific constant C-rate, the cell temperature, and the state of health (SOH) of the battery;
    determining a total dischargeable energy ($E_{tot}$) of the battery as a function of the battery current, the cell temperature, the reference dischargeable energy ($E_{ref}$) of the battery, and the state of health (SOH) of the battery; and
    determining the residual energy of the battery as a function of the state of energy (SOE) of the battery and the total dischargeable energy ($E_{tot}$) of the battery.

2. The method of claim 1, wherein the battery current value is smoothed by a moving average filter operating with a specific sample time.

3. The method of claim 1, wherein the dischargeable capacity of the battery is determined by a look-up table constructed using empirical data.

4. The method of claim 1, wherein the dischargeable capacity of the battery is determined by use of model-based results.

5. The method of claim 1, wherein the reference dischargeable energy ($E_{ref}$) of the battery is determined by a look-up table constructed using empirical data.

6. The method of claim 1, wherein the reference dischargeable energy ($E_{ref}$) of the battery is determined by use of model-based results.

7. The method of claim 1, wherein the total dischargeable energy ($E_{tot}$) of the battery is determined by a look-up table constructed using empirical data.

8. The method of claim 1, wherein the total dischargeable energy ($E_{tot}$) of the battery is determined by use of model-based results.

9. The method of claim 1, wherein the state of energy (SOE) of the battery is determined by a look-up table constructed using empirical data.

10. The method of claim 1, wherein the state of energy (SOE) of the battery is determined by use of model-based results.

11. A vehicle including a battery, wherein the battery includes a residual energy, and wherein the residual energy is estimated by a method comprising:
    determining a state of charge (SOC) of the battery;
    determining a dischargeable capacity of the battery as a function of a battery current, a cell temperature, and a state of health (SOH) of the battery;
    correcting the state of charge (SOC) of the battery as a function the state of charge (SOC) of the battery and the dischargeable capacity of the battery;
    determining a state of energy (SOE) of the battery as a function of the corrected state of charge (SOC), the cell temperature, and the state of health (SOH) of the battery;
    determining a reference dischargeable energy ($E_{ref}$) of the battery as a function of a specific constant C-rate, the cell temperature, and the state of health (SOH) of the battery;
    determining a total dischargeable energy ($E_{tot}$) of the battery as a function of the battery current, the cell temperature, the reference dischargeable energy ($E_{ref}$) of the battery, and the state of health (SOH) of the battery; and determining the residual energy of the battery as a function of the state of energy (SOE) of the battery and the total dischargeable energy ($E_{tot}$) of the battery.

12. The vehicle of claim 11, wherein the battery current value is smoothed by a moving average filter operating with a specific sample time.

13. The vehicle of claim 11, wherein the dischargeable capacity of the battery is determined by a look-up table constructed using empirical data.

14. The vehicle of claim 11, wherein the dischargeable capacity of the battery is determined by use of model-based results.

15. The vehicle of claim 11, wherein the reference dischargeable energy ($E_{ref}$) of the battery is determined by a look-up table constructed using empirical data.

16. The vehicle of claim 11, wherein the reference dischargeable energy ($E_{ref}$) of the battery is determined by use of model-based results.

17. The vehicle of claim 11, wherein the total dischargeable energy ($E_{tot}$) of the battery is determined by a look-up table constructed using empirical data.

18. The vehicle of claim 11, wherein the total dischargeable energy ($E_{tot}$) of the battery is determined by use of model-based results.

19. The vehicle of claim 11, wherein the state of energy (SOE) of the battery is determined by a look-up table constructed using empirical data.

20. The vehicle of claim 11, wherein the state of energy (SOE) of the battery is determined by use of model-based results.

\* \* \* \* \*